(12) United States Patent
Seddon

(10) Patent No.: US 11,605,561 B2
(45) Date of Patent: *Mar. 14, 2023

(54) BACKSIDE METAL REMOVAL DIE SINGULATION SYSTEMS AND RELATED METHODS

(71) Applicant: SEMICONDUCTOR COMPONENTS INDUSTRIES, LLC, Phoenix, AZ (US)

(72) Inventor: Michael J. Seddon, Gilbert, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/445,632

(22) Filed: Aug. 23, 2021

(65) Prior Publication Data
US 2021/0384077 A1   Dec. 9, 2021

Related U.S. Application Data

(63) Continuation of application No. 16/505,632, filed on Jul. 8, 2019, now Pat. No. 11,127,634.

(60) Provisional application No. 62/796,630, filed on Jan. 25, 2019.

(51) Int. Cl.
| | | |
|---|---|---|
| *H01L 21/00* | (2006.01) |
| *H01L 21/78* | (2006.01) |
| *H01L 21/66* | (2006.01) |
| *H01L 21/268* | (2006.01) |
| *H01L 21/3205* | (2006.01) |
| *H01L 21/3065* | (2006.01) |
| *H01L 21/324* | (2006.01) |
| *H01L 23/544* | (2006.01) |
| *H01L 21/3213* | (2006.01) |

(52) U.S. Cl.
CPC ............ *H01L 21/78* (2013.01); *H01L 21/268* (2013.01); *H01L 21/3065* (2013.01); *H01L 21/3247* (2013.01); *H01L 21/32051* (2013.01); *H01L 21/32131* (2013.01); *H01L 22/20* (2013.01); *H01L 23/544* (2013.01); *H01L 2223/5446* (2013.01)

(58) Field of Classification Search
CPC ... H01L 21/78; H01L 21/268; H01L 21/3065; H01L 21/32051; H01L 21/32131; H01L 21/3247; H01L 22/20; H01L 23/544; H01L 2223/5446
See application file for complete search history.

(56) References Cited

U.S. PATENT DOCUMENTS

| | | | | |
|---|---|---|---|---|
| 9,218,992 | B2 * | 12/2015 | Singh | H01L 21/3065 |
| 9,224,650 | B2 * | 12/2015 | Lei | H01L 21/6836 |
| 11,127,634 | B2 * | 9/2021 | Seddon | H01L 22/26 |
| 2011/0100967 | A1 * | 5/2011 | Yoo | G01N 27/00 219/121.73 |

(Continued)

*Primary Examiner* — Richard A Booth
(74) *Attorney, Agent, or Firm* — Adam R. Stephenson, LTD.

(57) ABSTRACT

Implementations of methods of singulating a plurality of die included in a substrate may include forming a groove through a backside metal layer through laser ablating a backside metal layer at a die street of a substrate and singulating a plurality of die included in the substrate through removing substrate material of the substrate in the die street.

20 Claims, 3 Drawing Sheets

(56) References Cited

U.S. PATENT DOCUMENTS

| | | | |
|---|---|---|---|
| 2015/0147850 A1* | 5/2015 | Stranzl | H01L 21/6835 438/118 |
| 2015/0279739 A1* | 10/2015 | Lei | H01L 21/3065 438/462 |
| 2017/0154768 A1* | 6/2017 | Zhao | H01L 21/6836 |
| 2019/0363018 A1 | 11/2019 | Seddon | |
| 2020/0132447 A1* | 4/2020 | Bijnen | G03F 9/7034 |

* cited by examiner

BACKSIDE METAL REMOVAL DIE SINGULATION SYSTEMS AND RELATED METHODS

CROSS REFERENCE TO RELATED APPLICATIONS

This application is a continuation application of the earlier U.S. Utility Patent Application to Michael J. Seddon entitled "Backside Metal Removal Die Singulation Systems and Related Methods," application Ser. No. 16/505,632, filed Jul. 8, 2019, the disclosure of which is hereby incorporated entirely herein by reference.

This application claims the benefit of the filing date of U.S. Provisional Patent Application 62/796,630, entitled "BACKSIDE METAL REMOVAL DIE SINGULATION SYSTEMS AND RELATED METHODS" to Michael J. Seddon, which was filed on Jan. 25, 2019, the disclosure of which is hereby incorporated entirely herein by reference.

BACKGROUND

1. Technical Field

Aspects of this document relate generally to plasma die singulation systems and methods. More specific implementations involve methods of singulating semiconductor die from a substrate.

2. Background

Semiconductor devices include integrated circuits found in common electrical and electronic devices, such as phones, desktops, tablets, other computing devices, and other electronic devices. The devices are separated through singulating a wafer of semiconducting material into a plurality of semiconductor die. Various layers may be coupled to the front side and/or the backside of the wafer. Upon singulation, the die can be mounted on a package and electrically integrated with the package which may then be used in the electrical or electronic device.

SUMMARY

Implementations of methods of singulating a plurality of die included in a substrate may include forming a groove through a backside metal layer through laser ablating a backside metal layer at a die street of a substrate and singulating a plurality of die included in the substrate through removing substrate material of the substrate in the die street.

Implementations of methods of singulating a plurality of die included in a substrate may include one, all, or any of the following:

The substrate may be less than 50 micrometers thick.

The substrate may be less than 30 micrometers thick.

Removing the substrate material of the substrate in the die street may include removing through one of sawing or lasering.

Removing the substrate material of the substrate in the die street may include removing using plasma etching.

When removing the substrate material of the substrate in the die street through sawing or lasering, the method may include removing damage from a sidewall of the die street through remote plasma healing.

Singulating the plurality of die comprised in the substrate through plasma etching may include removing a portion of the substrate material of the substrate having a width less than a width of the die street.

Implementations of methods of singulating a plurality of die included in a substrate may include forming, on a first side of a substrate, one or more layers, forming a backside metal layer on the second side of the substrate, laser ablating a groove into the backside metal layer to expose at least a portion of the substrate, and singulating a plurality of die comprised in the substrate through plasma etching at the portion of the substrate exposed by the groove. The groove may be located in a die street of the substrate.

Implementations of methods of singulating a plurality of die included in a substrate may include one, all, or any of the following:

Singulating a plurality of die included in the substrate through plasma etching may include plasma etching from the second side of the substrate, The method may include thinning the second side of the substrate to less than 50 micrometers thick.

The method of singulating a plurality of die in a substrate may include monitoring the laser ablation of the groove using a camera facing the second side of the substrate.

The method of singulating a plurality of die in a substrate may include making near-real-time adjustments to one or more laser parameters based upon data collected through monitoring the laser ablation of the groove using a camera facing the second side of the substrate.

Singulating the plurality of die comprised in the substrate through plasma etching may include removing a portion of the substrate material of the substrate having a width less than a width of the die street.

The backside metal layer may include copper.

Implementations of methods of singulating a plurality of die included in a substrate may include using a laser, grooving through a backside metal layer in a die street coupled to a substrate, actively monitoring a formation of a groove in the backside metal layer, and singulating a plurality of die included in the substrate through removing a substrate material at the grooves in the back metal layer.

Implementations of methods of singulating a plurality of die included in a substrate may include one, all, or any of the following:

Actively monitoring the formation of the groove in the backside metal layer may include monitoring using a camera facing the backside metal layer.

The method of singulating a plurality of die in a substrate may include making near-real-time adjustments to one or more laser parameters based upon data collected through monitoring the formation of the groove using a camera facing the second side of the substrate.

Removing the substrate material at the grooves may include removing through plasma etching.

The method of singulating a plurality of die from a substrate may include removing damage from a sidewall of the die street through remote plasma healing.

The substrate may be thinned to less than 50 micrometers.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended backside metal removal die singulation systems and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such backside metal removal die singulation systems and related methods, and implementing components and methods, consistent with the intended operation and methods.

Figure 1:
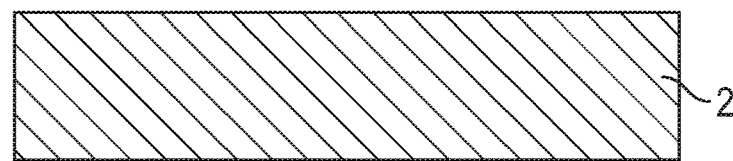
FIG. 1 is a cross sectional side view of a portion of a substrate.

Referring to FIG. 1, a cross sectional side view of a portion of a substrate 2 is illustrated. The term "substrate" refers to a semiconductor substrate as a semiconductor substrate is a common type of substrate, however, "substrate" is not an exclusive term that is used to refer to all semiconductor substrate types. Similarly, the term "substrate," may refer to a wafer as a wafer is a common type of substrate, however, "substrate" is not an exclusive term that is used to refer to all wafers. The various semiconductor substrate types disclosed in this document that may be utilized in various implementations may be, by non-limiting example, round, rounded, square, rectangular, or any other closed shape. In various implementations, the substrate 2 may include various substrate materials such as, by non-limiting example, single crystal silicon, silicon dioxide, glass, gallium arsenide, sapphire, ruby, silicon-on-insulator, silicon carbide, polycrystalline or amorphous forms of any of the foregoing, and any other substrate material useful for constructing semiconductor devices. In particular implementations, the substrate may be a silicon-on-insulator substrate.

Figure 2:
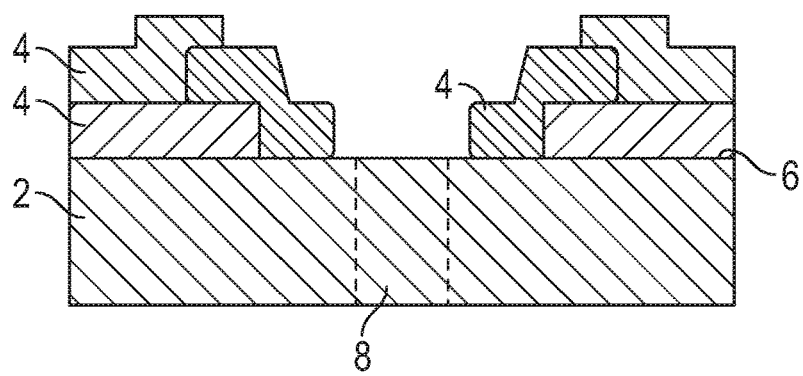
FIG. 2 is a cross sectional side view of a plurality of layers coupled to a first side of the substrate of FIG. 1.

Referring to FIG. 2, a cross sectional side view of a plurality of layers 4 coupled to a first side of the substrate of FIG. 1 is illustrated. In various implementations, before singulating a plurality of die from the substrate 2, the method of forming a plurality of die may include forming a plurality of die on the substrate. This may include forming a plurality of layers 4 on a first side 6 the substrate 2. As illustrated by FIG. 2, the plurality of layers 4 may be patterned, and in various implementations, may be patterned (or otherwise removed) to not be present in a die street 8 area of the substrate 2. The plurality of layers may include, by non-limiting example, one or more metal layers, one or more passivation layers, any other layer, and any combination thereof. In various implementations passivation layers may include, by non-limiting example, silicon nitride, oxides, metal electrical test structures, electrical test pads, silicon dioxide, polyimides, metal pads, residual underbump metallization (UBM), any combination thereof, and any other layer or material capable of facilitating electrical or thermal connection between the one or more semiconductor die and/or protecting the one or more semiconductor die from contaminants. In various implementations, the plurality of die may include power semiconductor devices, such as, by non-limiting example, a MOSFET, an IGBT, or any other power semiconductor device. In other implementations, the plurality of die may include non-power semiconductor devices.

Figure 3:
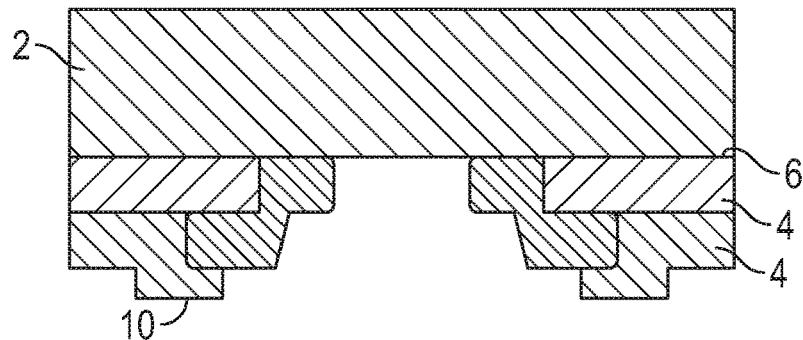
FIG. 3 is a view of the substrate and plurality of layers of FIG. 2 in a flipped orientation.
Figure 4:
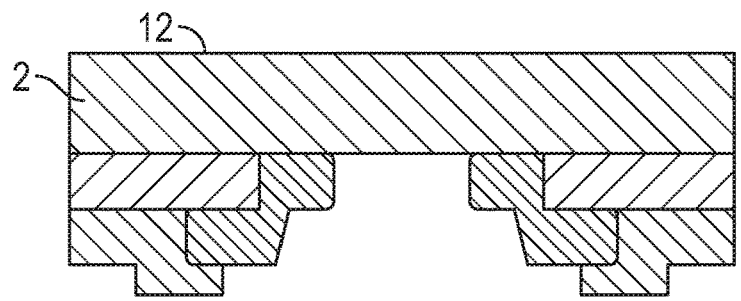
FIG. 4 is a view of substrate and plurality of layers of FIG. 3 with the substrate thinned.

Referring to FIG. 3, a view of the substrate and plurality of layers of FIG. 2 in a flipped orientation is illustrated. The method of forming and singulating a plurality of die includes flipping the substrate and, though not illustrated, in various implementations, the method may include applying a tape to a first side 10 of the plurality of layers 4. Such a tape may be a backgrinding tape in various implementations. Referring to FIG. 4, a view of substrate and plurality of layers of FIG. 3 with the substrate thinned is illustrated. In various implementations, the method of forming and singulating a plurality of die may include thinning the second side 12 of the substrate 2. In various implementations, the substrate 2 may be thinned to a thickness less than 50 micrometers (μm). In other implementations, the substrate 2 may be thinned to a thickness less than 30 μm. In still other implementations, the substrate 2 may be thinned to a thickness less than 100 μm, more than 100 μm, and in other various implementations, the substrate 2 may not be thinned. In particular implementations, the substrate 2 may be thinned to a thickness of about 25 μm, and in other particular implementations, the substrate may be thinned to a thickness of about 75 μm. The substrate 2 may be thinned through backgrinding, etching, or any other thinning technique. In particular implementations, the substrate is thinned using a backgrinding process marketed under the trade name TAIKO by DISCO of Tokyo, Japan to provide an edge ring supporting the thinned substrate.

Figure 5:
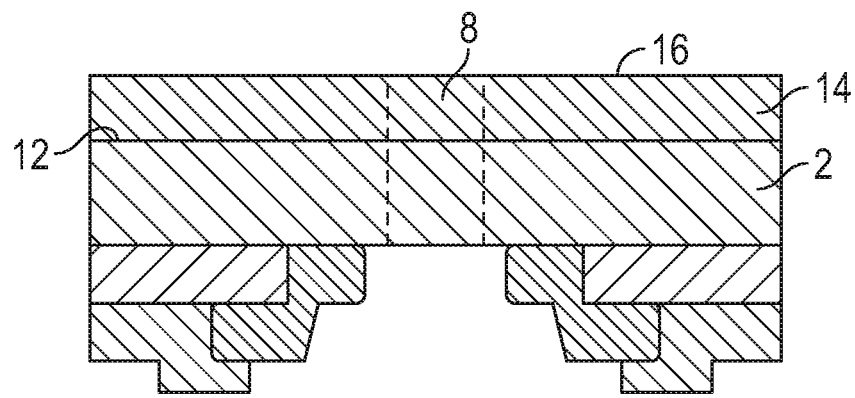
FIG. 5 is a view of thinned substrate and plurality of layers of FIG. 4 with a backside metal layer coupled to the second side of the substrate.

Referring to FIG. 5, a view of the thinned substrate and plurality of layers of FIG. 4 with a backside metal layer coupled to the second side of the substrate is illustrated. The method of forming a plurality of die and singulating the plurality of die includes forming a backside metal layer 14 on the second side of the substrate 2. In particular implementations, the backside metal layer 14 may be copper or a copper alloy. In other implementations, the backside metal layer may include any other type of metal, alloy thereof, or combination thereof. In various implementations, the backside metal layer may include an adhesion layer like Ti, TiW, TiN, and/or Al, and any combination thereof followed by a layer of a diffusion barrier such as Ni, NiV, and/or Cu, and any combination thereof followed by an oxide inhibitor (to protect the diffusion barrier from oxidizing) and a solderable metal such as Au, Ag, and/or Sn and any combination thereof. In various implementations, the backside metal layer may be 10 μm thick. In other implementations, the backside metal layer may be more or less thick than 10 μm. In implementations where 10 μm of Cu is used, then a seed metal layer or under bump metal layer (UBM) may be deposited which is used for electrolytic plating. The seed metal layers typically comprise of an adhesion layer like that previously discussed (Al, Ti, TiW, and/or TiN, or any combination thereof) followed the plated material (Cu or Ni), followed by a diffusion barrier for the diffusion layer such as Au, Sn, and/or Ag or any combination there. The backside metal layer 14 may be evaporated or sputtered onto the substrate 2, however, in other implementations (including implementations having thicker substrates), the backside metal layer 14 may be plated onto the substrate 2 or formed on the substrate using another technique. In various implementations, the backside metal layer 14 may be formed over the entire second side 12 of the substrate 2. In such implementations, the backside metal layer 14 may strengthen the substrate 2. In various implementations, the outer surface 16 of the backside metal layer may be coated with a film or other layer in order to facilitate removal of any slag resulting from the laser ablation disclosed later herein. This layer may be applied using spray coating, spin coating, or other coating techniques.

Prior to any actual singulation of a plurality of the die, the method of singulating the plurality of die in the substrate may include aligning the substrate. In various implementations, the method may include aligning the substrate from the first side (which may be the front side, or bottom/tape facing side as oriented in FIG. 5) using optics or a camera. In such implementations, the optics or camera may be placed below the substrate and may detect a plurality of alignment features formed on or within the substrate. In various implementations, the alignment features may be formed on or within the die street 8 of the substrate. In implementations having tape coupled to the first side 10 of the plurality of layers, the optics or camera may be configured to detect the plurality of alignment features through the tape. In a particular implementation, the substrate may be aligned using an infrared (IR) camera and IR alignment features. In other implementations, the alignment features may be included on an outer surface 16 of the backside metal layer 14. In such implementations, rather than requiring optics or a camera to be below the substrate, the optics or camera may align the substrate from above the substrate (as oriented in FIG. 5). In still other implementations where the substrate includes a ring around the perimeter after thinning the substrate, the method of aligning the substrate may include placing alignment features in the periphery of the substrate and grinding down the perimeter ring. The substrate may then be aligned from the backside, or second side 12 of the substrate by using the alignment features along the outer edge of the device. Such an alignment method may include using an IR camera.

Figure 6:
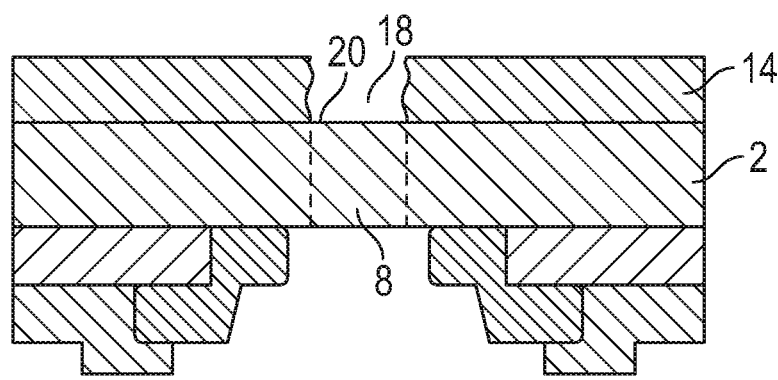
FIG. 6 is a view of the backside metal layer of FIG. 5 having a groove formed therein.

Referring to FIG. 6, a view of the backside metal layer of FIG. 5 having a groove formed therein is illustrated. Upon aligning the substrate, the method of singulating a plurality of die in the substrate 2 includes forming a groove 18 through the backside metal layer 14. The groove 18 is located in/positioned in the die street 8. In various implementations, the groove 18 may be as wide as the die street 8 or wider than the die street. The groove 18 may be formed through laser ablating a backside metal layer 14 at the die street 8 of the substrate 2. As illustrated, in various implementations the groove 18 extends through the backside metal layer 14. In this manner, at least a portion 20 of the substrate 2 is exposed. In various implementations, the formation of the groove is stopped at the substrate 2. Because laser ablation may form a groove more slowly in the backside metal layer 14 as compared to the substrate 2, care may be required to prevent the laser beam from laser ablating a groove deep into, or through, the substrate 2. In order to facilitate the formation of the groove 18 stopping at the substrate 2, in various implementations the method includes actively monitoring the formation of a groove 18 in the backside metal layer 14. In various implementations, a camera facing the backside metal layer 14 may be used to actively monitor the formation of the groove 18. Active monitoring may include monitoring the cleared backside metal and/or measuring the thickness variation of the removed backside metal layer as compared to the original thickness of the backside metal layer.

In such implementations, near-real-time adjustments may be made to one or more laser parameters based upon data collected during the active monitoring to alter the laser characteristics to ensure just the back metal is being ablated. In particular implementations, near-real-time adjustments may include the camera monitoring the formation of the groove one inch behind the laser beam, and, based upon the data collected from the monitoring, immediately making adjustments to the parameters of the laser. In other implementations, near-real-time adjustments may include the camera actively monitoring the formation of the groove less than one inch behind the laser beam or more than one inch behind the laser beam. The parameters of the laser beam which may be adjusted may include, by non-limiting example, laser power, pulse energy, pulse frequency, spot size, focal point, focal depth, and/or speed of movement of the laser beam across the backside metal layer 14. In various implementations, especially implementations involving thinned substrates, active monitoring of the formation of the groove 18 may be critical as the process window for forming the groove may be narrow. This is in part because variations in the thickness of the tape upon which the thinned substrate is mounted may be 5 microns or more across the tape, meaning that for a back metal layer of 10 microns thickness, the laser beam will see 50% variation in apparent thickness of the back metal layer at a particular focal depth just because of tape thickness variation. Through such active monitoring and near-real-time adjustments, any tilt in the substrate or chuck and any variations in the thickness of the tape may be compensated for by adjusting the parameters of the laser. In this manner, the backside metal layer 14 may have a groove 18 formed entirely through the thickness without the groove being formed into (or substantially into) the substrate 2.

Figure 7:
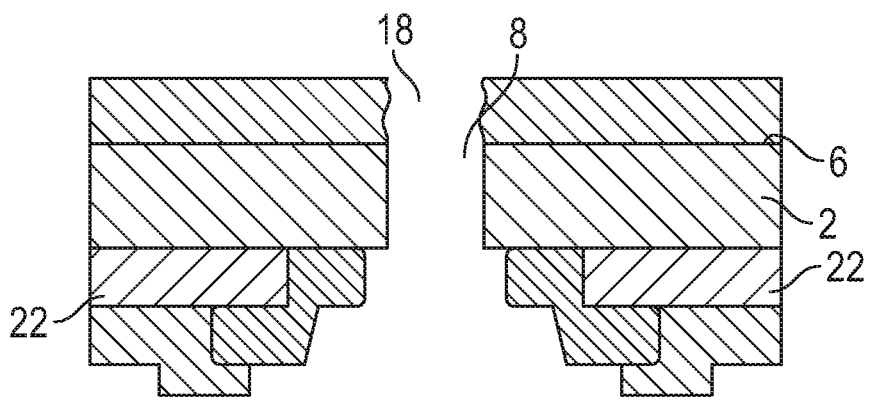
FIG. 7 is a view of the substrate of FIG. 6 singulated into a plurality of die.

Referring to FIG. 7, a view of the substrate of FIG. 6 singulated into a plurality of die is illustrated. The method of singulating a plurality of die 22 in a substrate 2 includes singulating the plurality of die in the substrate through removing substrate material of the substrate 2 at the grooves 18 in the die street 8. As illustrated by FIG. 7, the plurality of die are singulated from the backside of the substrate. Because of this, there is no need to flip the substrate over in order to singulate the substrate from the front side. The ability to singulate the die from the backside may reduce damage to the substrate, and especially a thinned substrate, as it requires the substrate to be handled less, increasing the yield of the process correspondingly. Further, in implementations where the plurality of die are singulated from the backside through laser ablation (as disclosed later herein), because it is singulated from the backside and not the front side, redeposition of the back metal layer may be reduced as residual backmetal may more easily flow away from the sidewalls of the die.

In various implementations, the plurality of die 22 may be singulated through removing the substrate material of the substrate 2 in the die street 8 through plasma etching from the second side 6 of the substrate 2 at the portion 20 of the substrate exposed by the groove 18. In various implementations, a plasma etch process marketed under the tradename BOSCH® by Robert Bosch GmbH, of Stuttgart, Germany (the "Bosch process"), may be used to singulate the substrate 2 into a plurality of die 22. In other implementations, other plasma etch processes may be used to singulate the plurality of die 22 from the substrate 2. In various implementations, though not illustrated herein, singulating the plurality of die included in the substrate through plasma etching may include removing a portion of the substrate material of the substrate having a width less than a width of the die street. In such implementations, the width of the removed portion from plasma etching is less than the width of the die street as plasma die singulation is capable (with the use of photolithography or other masking techniques) of creating a die street narrower than the die street created through laser ablation. In other implementations, and as illustrated by FIG. 7, the width of the removed portion of the substrate may be the same as the width of the die street 8 by singulating the plurality of die 22 through removing through plasma etch all of the substrate material of the substrate 2 in the die street 8.

Figure 8:
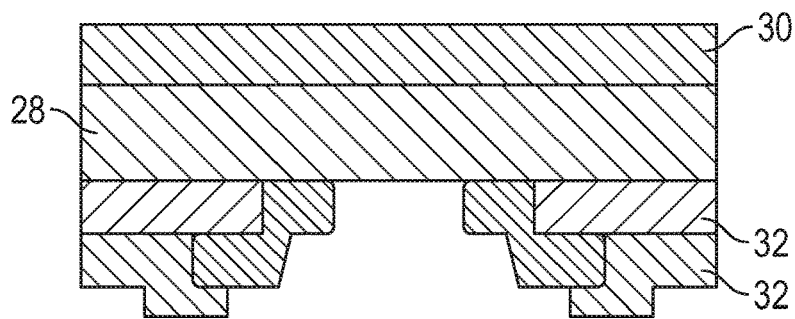
FIG. 8 is a view of a backside metal layer coupled to a substrate.
Figure 9:
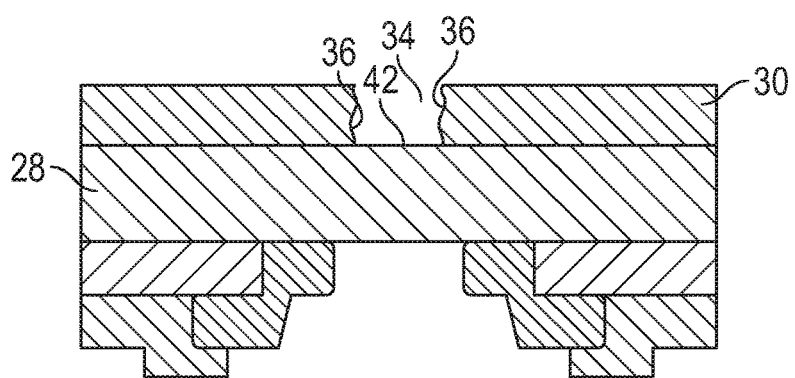
FIG. 9 is a view of the backside metal layer of FIG. 8 having a groove formed therein.

Referring to FIGS. 8-11, a method for singulating a plurality of die similar to the method illustrated by FIGS. 5-7 is illustrated. Referring specifically to FIG. 8, a view of a backside metal layer coupled to a substrate is illustrated. The substrate 28 may be the same as or similar to any substrate disclosed herein, the plurality of layers 32 coupled to the substrate may be the same as or similar to any type of plurality of layers disclosed herein, and the backside metal layer 30 may include any type of backside metal layer disclosed herein. Likewise, the backside metal layer 30, the plurality of layers 32, and the substrate 28 may be formed using the same or a similar method as any method disclosed herein. The method of singulating a plurality of die may also include aligning the substrate using any alignment technique disclosed herein. Referring to FIG. 9, a view of the back-metal layer of FIG. 8 having a groove formed therein is illustrated. The method of singulating a plurality of die includes forming a groove 34 in the backside metal layer 30 using the same or a similar method as the methods for forming grooves disclosed herein. As illustrated by FIG. 9, the sidewalls 36 of the groove 34 may be rough as a result of the laser ablation.

Figure 10:
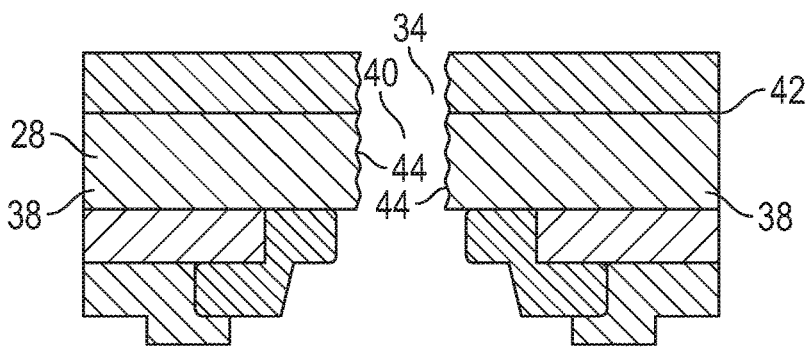
FIG. 10 is a view of the substrate of FIG. 9 singulated into a plurality of die.

Referring to FIG. 10, a view of the substrate of FIG. 9 singulated into a plurality of die is illustrated. The method of singulating a plurality of die 38 in a substrate 28 includes singulating the plurality of die in the substrate through removing substrate material of the substrate 28 at the grooves 34 in the die street 40. As illustrated by FIG. 10, the plurality of die are singulated from the second side 42, or backside, of the substrate 28. Because of this, there is no need to flip the substrate 28 over in order to singulate the substrate from the front side. As previously discussed, the ability to singulate the plurality of die 38 from the backside of the substrate 28 may reduce damage to the substrate, and especially a thinned substrate, as it requires the substrate 28 to be handled less. In various implementations, the plurality of die 38 may be singulated through removing the substrate material of the substrate 28 in the die street 40 through sawing or lasering at the exposed portion 42 of the substrate 28 exposed by the groove 34. In particular implementations, the method of singulating the plurality of die may include forming the groove 34 through laser ablation and singulating the plurality of die 38 through laser ablation. The two-step laser ablation process may prevent re-deposition of the backside metal layer 30 into the substrate 28 as the backside metal layer 30 in the die street 40 will be cleared away prior to the singulation of the plurality of die 38.

As illustrated by FIG. 10, when singulating the plurality of die 38 using a laser beam or a saw blade, the sidewalls 44 of each die results in the production of damage, chips, and/or cracks in the sidewalls 44 of the die street 40 and layers adjacent to the die street. The presence of the cracks and chips has the potential to compromise the reliability of the resulting semiconductor package (and reduce the die strength) if/when the cracks and chips propagate into the device portion of the semiconductor die. Since the saw process involves the rubbing of the rotating blade against the substrate surface, and the laser process involves melting and ablating the material under the focus of a laser beam on the substrate surface, the damage, chipping, and cracking can only be influenced through saw or laser processing variables (such as, by non-limiting example, substrate feed speed, blade kerf width, cut depth, multiple saw cuts, blade materials, laser power, focal depth, pulse energy, pulse repetition rate, etc.) but not eliminated entirely.

Figure 11:
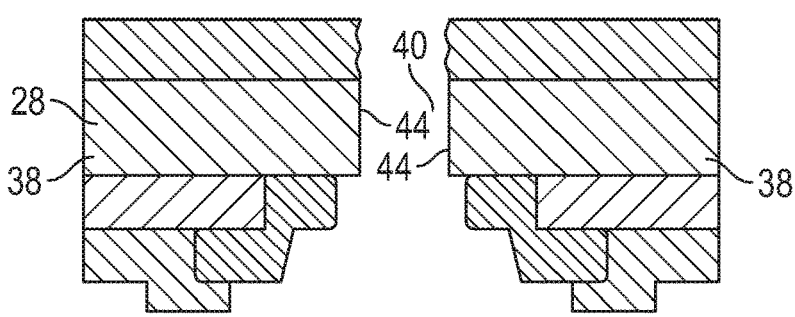
FIG. 11 is a view of the plurality of die of FIG. 10 having smoothed/healed sidewalls.

Referring to FIG. 11, a view of the plurality of die of FIG. 10 having smoothed sidewalls is illustrated. In implementations where the plurality of die 38 are singulated through lasering or sawing, the method of singulating the plurality of die may include removing damage from a sidewall 44 of the die street 40 through remote plasma healing. In such implementations, an isotropic or substantially isotropic plasma etch may be applied to the sidewalls 44 of the die street 40. The plasma may penetrate/facilitate reaction with the materials of the cracks and/or chips of the sidewalls 44 formed when the plurality of die 38 were singulated from the substrate 28. As the plasma encounters the cracks and/or chips, the damaged portion(s) of the substrate 28 may etch away and result in smoothed, or healed, sidewalls 44 of the die street, as illustrated by FIG. 11.

In places where the description above refers to particular implementations of backside metal removal die singulation systems and related methods and implementing components, sub-components, methods and sub-methods, it should be readily apparent that a number of modifications may be made without departing from the spirit thereof and that these implementations, implementing components, sub-components, methods and sub-methods may be applied to other backside metal removal die singulation systems and related methods.

What is claimed is:

1. A method of singulating a plurality of die comprised in a substrate, the method comprising:
    forming a groove through a backside metal layer through laser ablating the backside metal layer at a die street of a substrate; and
    singulating a plurality of die comprised in the substrate through plasma etching at the die street;
    wherein the backside metal layer is used as a mask for the plasma etching at the die street.

2. The method of claim 1, wherein the substrate is less than 50 micrometers thick.

3. The method of claim 1, wherein the substrate is less than 30 micrometers thick.

4. The method of claim 1, wherein the backside metal layer comprises copper.

5. The method of claim 1, wherein the backside metal layer is substantially 10 micrometers thick.

6. The method of claim 1, wherein the backside metal layer is one of evaporated or sputtered onto the substrate.

7. The method of claim 1, wherein singulating the plurality of die comprised in the substrate through plasma etching further comprises removing a portion of the substrate having a width less than a width of the die street.

8. A method of singulating a plurality of die comprised in a substrate, the method comprising:
   forming, on a first side of a substrate, one or more layers;
   forming a backside metal layer on a second side of the substrate;
   laser ablating a groove into the backside metal layer to expose at least a portion of the substrate, wherein the groove is located in a die street of the substrate; and
   using the backside metal layer as a mask, singulating a plurality of die comprised in the substrate through plasma etching, from the second side of the substrate, at the portion of the substrate exposed by the groove.

9. The method of claim 8, further comprising patterning the one or more layers.

10. The method of claim 8, further comprising thinning the second side of the substrate, wherein the substrate is thinned to less than 50 micrometers.

11. The method of claim 8, further comprising monitoring the laser ablating of the groove using a camera facing the second side of the substrate.

12. The method of claim 11, further comprising making near-real-time adjustments to one or more laser parameters based upon data collected through the monitoring.

13. The method of claim 8, wherein singulating the plurality of die comprised in the substrate through plasma etching further comprises removing a portion of the substrate of the substrate having a width less than a width of the die street.

14. The method of claim 8, wherein the backside metal layer comprises copper.

15. A method of singulating a plurality of die comprised in a substrate, the method comprising:
   using a laser, grooving through a backside metal layer in a die street coupled to a substrate; and
   using the backside metal layer as a mask, singulating a plurality of die comprised in the substrate through removing, from a side of the substrate facing the backside metal layer, substrate material at a groove in the backside metal layer.

16. The method of claim 15, further comprising actively measuring a thickness variation of the backside metal layer that is grooved as compared to an original thickness of the backside metal layer.

17. The method of claim 15, further comprising making near-real-time adjustments to one or more laser parameters based upon data collected during active monitoring of grooving through the backside metal layer.

18. The method of claim 16, wherein removing the substrate material at the groove further comprises removing through plasma etching.

19. The method of claim 16, wherein the backside metal layer is substantially 10 micrometers thick.

20. The method of claim 16, wherein the substrate is thinned to less than 50 micrometers.

\* \* \* \* \*